(12) United States Patent
Huang et al.

(10) Patent No.: US 11,729,923 B1
(45) Date of Patent: Aug. 15, 2023

(54) ELECTRONIC DEVICE ASSEMBLY

(71) Applicant: Primax Electronics Ltd., Taipei (TW)

(72) Inventors: Shu An Huang, Taipei (TW);
Chun-Lin Chu, Taipai (TW);
Ting-Sheng Wang, Taipei (TW);
Ying-Che Tseng, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 17/863,031

(22) Filed: Jul. 12, 2022

(30) Foreign Application Priority Data

May 30, 2022 (TW) .................................. 111120122

(51) Int. Cl.

| H05K 5/00  | (2006.01) |
| H05K 5/02  | (2006.01) |
| H01R 13/62 | (2006.01) |
| H01R 13/24 | (2006.01) |
| H01F 7/02  | (2006.01) |

(52) U.S. Cl.
CPC ....... *H05K 5/0069* (2013.01); *H01R 13/2471* (2013.01); *H01R 13/6205* (2013.01); *H05K 5/0217* (2013.01); *H05K 5/0247* (2013.01); *H01F 7/02* (2013.01)

(58) Field of Classification Search
USPC ........................................................ 361/752
See application file for complete search history.

(56) References Cited

U.S. PATENT DOCUMENTS

| 2014/0120745 A1* | 5/2014 | Wang | .................... | G06F 1/1632 |
| | | | | 439/39 |
| 2015/0236445 A1* | 8/2015 | Wang | ................. | H01R 13/6205 |
| | | | | 439/38 |
| 2022/0013954 A1* | 1/2022 | Jani | .................... | H01R 13/6205 |

* cited by examiner

*Primary Examiner* — Hung S. Bui
(74) *Attorney, Agent, or Firm* — KIRTON McCONKIE; Evan R. Witt

(57) ABSTRACT

An electronic device assembly includes a first electronic device and a second electronic device. The first electronic device includes a first wall body, a first opening, a sliding seat, a first magnetic attraction element, an elastic element and a connecting terminal. When the second wall body is close to the first wall body, the second magnetic attraction element and the first magnetic attraction element are magnetically attracted by each other. Consequently, the sliding seat is moved toward the first wall body, the elastic element is compressed, and the connecting terminal is protruded outside the first opening and contacted with the connector. When the second wall body is separated from the first wall body, the compressed elastic element is restored. Consequently, the sliding seat is moved away from the first wall body and the connecting terminal is retracted inside the first electronic device.

15 Claims, 7 Drawing Sheets

ELECTRONIC DEVICE ASSEMBLY

FIELD OF THE INVENTION

The present invention relates to an electronic device assembly, and more particularly to a magnetic-attraction type electronic device assembly.

BACKGROUND OF THE INVENTION

Conventionally, a connecting terminal of an electronic device is connected with a connector of another electronic device in order to transfer electric power or signals. However, since the connecting terminal is usually protruded outside the electronic device, some drawbacks occur. For example, if the connecting terminal is hit by an external force, the connecting terminal is readily damaged. In other words, the design of the connecting terminal of the conventional electronic device needs to be further improved.

SUMMARY OF THE INVENTION

In order to overcome the drawbacks of the conventional technologies, the present invention provides a magnetic-attraction type electronic device assembly. The electronic device assembly includes a first electronic device and a second electronic device. The first electronic device includes a connecting a connecting terminal. The connecting terminal can be retracted inside the first electronic device without being exposed outside. The second electronic device includes a connector. When the second electronic device is close to the first electronic device, the connecting terminal is moved in response to the magnetic attraction between the electronic device and the second electronic device. After the connecting terminal is protruded outside the first electronic device and contacted with the connector, the connecting terminal is electrically connected with the connector.

In accordance with an aspect of the present invention, an electronic device assembly is provided. The electronic device assembly includes a first electronic device and a second electronic device. The first electronic device includes a first wall body, a first opening, a sliding seat, a first magnetic attraction element, an elastic element and a connecting terminal. The first opening is formed in the first wall body. The sliding seat is disposed within the first electronic device. The first magnetic attraction element is fixed on the sliding seat. The elastic element is arranged between the sliding seat and the first wall body. The connecting terminal is fixed on the sliding seat. The second electronic device includes a second wall body, a connector and a second magnetic attraction element. A portion of the connector is exposed outside the second wall body. When the second wall body is close to the first wall body, the second magnetic attraction element and the first magnetic attraction element are magnetically attracted by each other. Consequently, the sliding seat is driven to be moved toward the first wall body. As the sliding seat is moved toward the first wall body, the elastic element is compressed, and the connecting terminal is protruded outside the first opening and contacted with the connector. When the second wall body is separated from the first wall body, the compressed elastic element is restored. Consequently, the sliding seat is moved away from the first wall body and the connecting terminal is retracted inside the first electronic device.

In an embodiment, the first electronic device further includes a circuit board. The connecting terminal is installed on the circuit board. The circuit board is fixed on the sliding seat.

In an embodiment, the connecting terminal includes a Pogo pin.

In an embodiment, the Pogo pin includes a tube, a plunger and a spring. The spring is arranged between the tube and the plunger.

In an embodiment, the first electronic device further includes a guiding track, and the sliding seat is movable along the guiding track.

In an embodiment, the first electronic device further includes a stopping structure. After the compressed elastic element is restored and the sliding seat is moved away from the first wall body, the sliding seat is contacted with the stopping structure.

In an embodiment, the first electronic device further includes a guiding track, and the guiding track includes an end part. After the compressed elastic element is restored and the sliding seat is moved away from the first wall body, the sliding seat is contacted with the end part of the guiding track.

In an embodiment, the sliding seat includes a receiving recess, and the first magnetic attraction element is disposed within the receiving recess.

In an embodiment, the second electronic device further includes a receiving recess. The receiving recess is formed in the second wall body. The second magnetic attraction element is disposed within the receiving recess.

In an embodiment, the first magnetic attraction element is a magnet, and the second magnetic attraction element is another magnet or a magnetic conductor. The magnetic conductor is made of iron, nickel or cobalt.

In an embodiment, the second magnetic attraction element is a magnet, and the first magnetic attraction element is another magnet or a magnetic conductor. The magnetic conductor is made of iron, nickel or cobalt.

In an embodiment, the sliding seat includes a receiving recess. When the sliding seat is moved toward the first wall body, the elastic element is accommodated within the receiving recess.

In an embodiment, the elastic element is a spring, a torsion spring, a shrapnel, a rubber ring or a foam structure.

In an embodiment, the second electronic device further includes a second opening. The second opening is formed in the second wall body. The connector is exposed to the second opening.

In an embodiment, the elastic element is compressed in response to a magnetic attractive force between the between the first magnetic attraction element and the second magnetic attraction element.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. In the following embodiments and drawings, the elements irrelevant to the concepts of the present invention are omitted and not shown.

Figure 1:
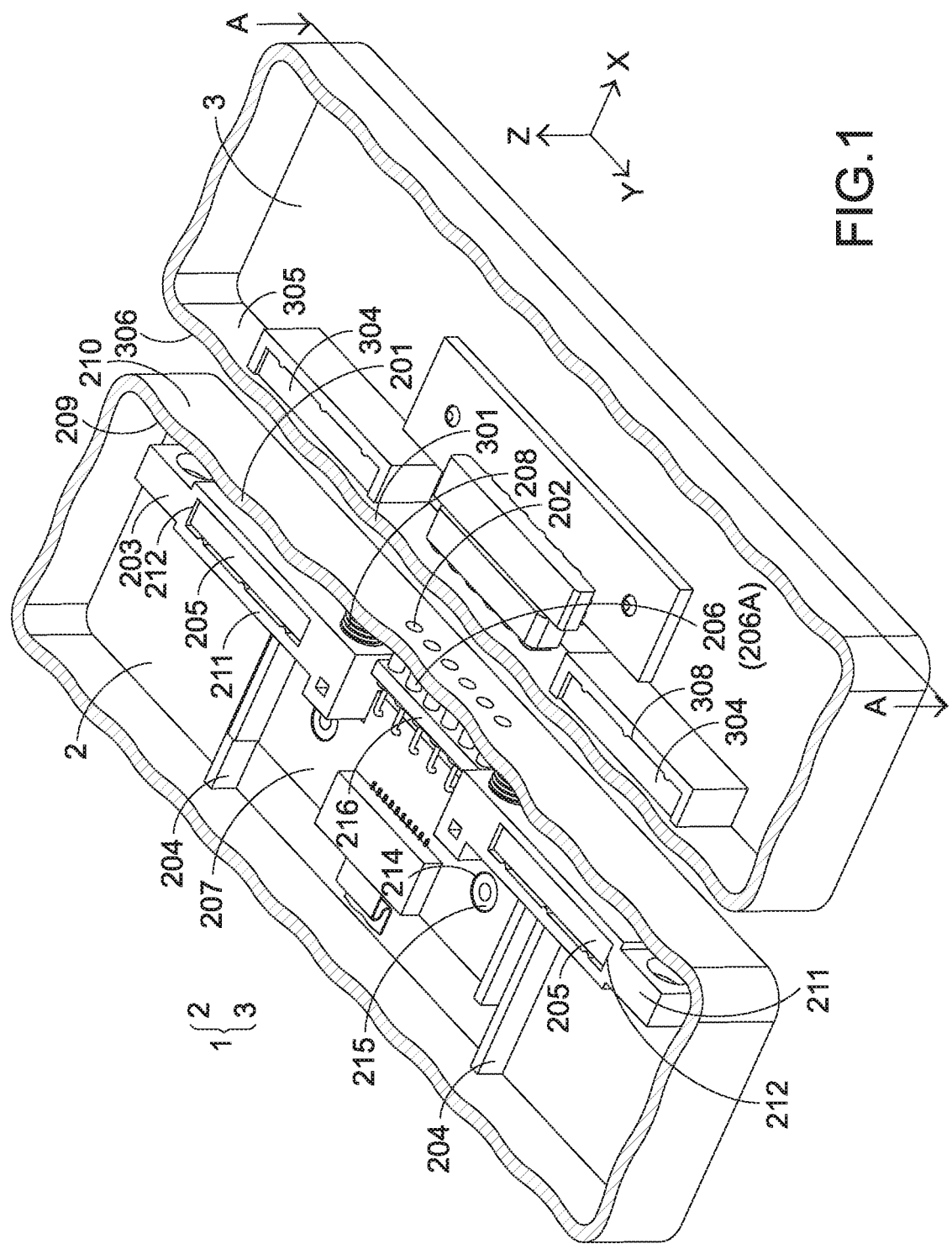
FIG. 1 is a schematic perspective view illustrating a portion of an electronic device assembly according to an embodiment of the present invention.
Figure 2:
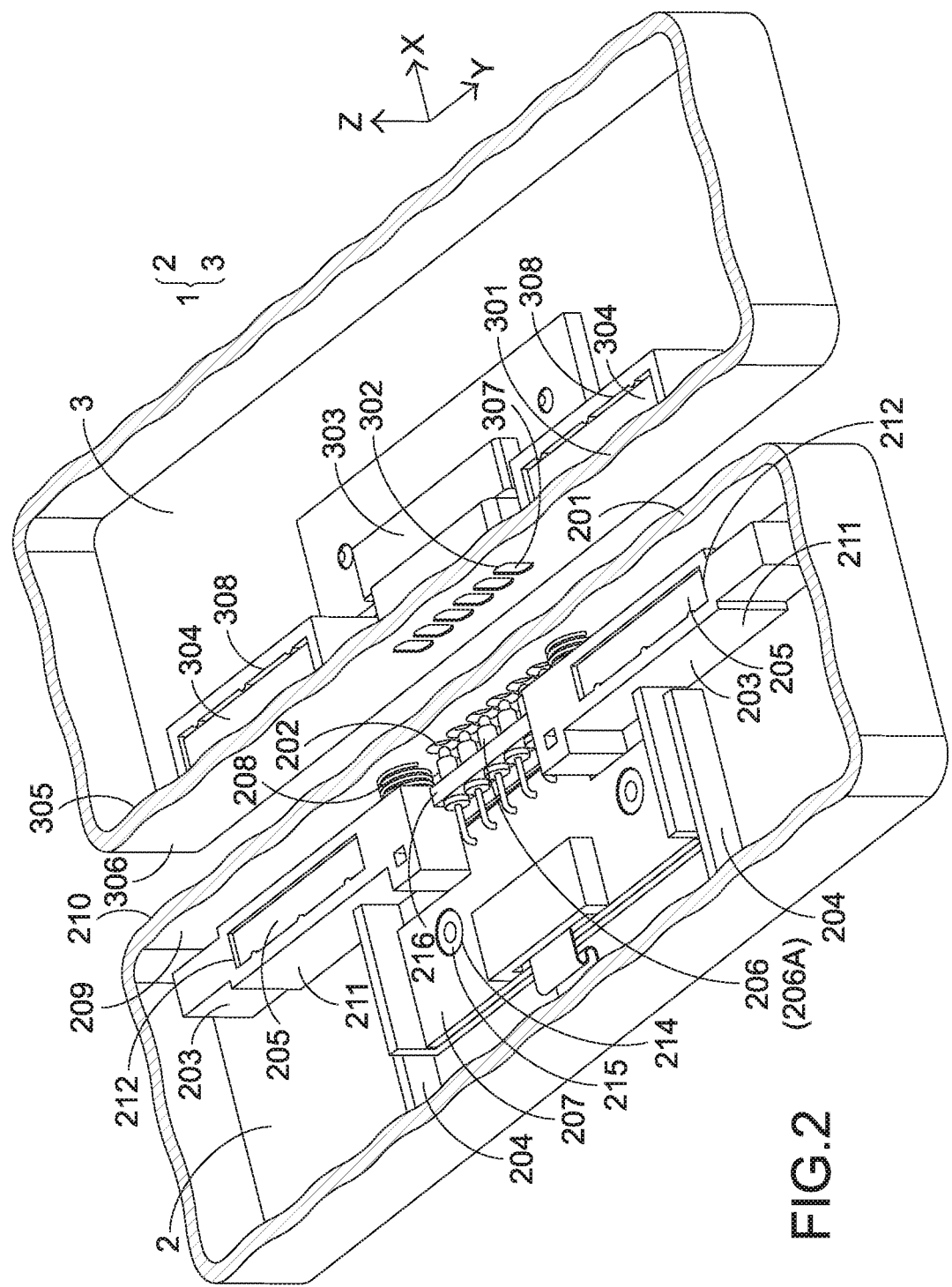
FIG. 2 is a schematic perspective view illustrating a portion of the electronic device assembly as shown in FIG. 1 and taken along another viewpoint.
Figure 3:
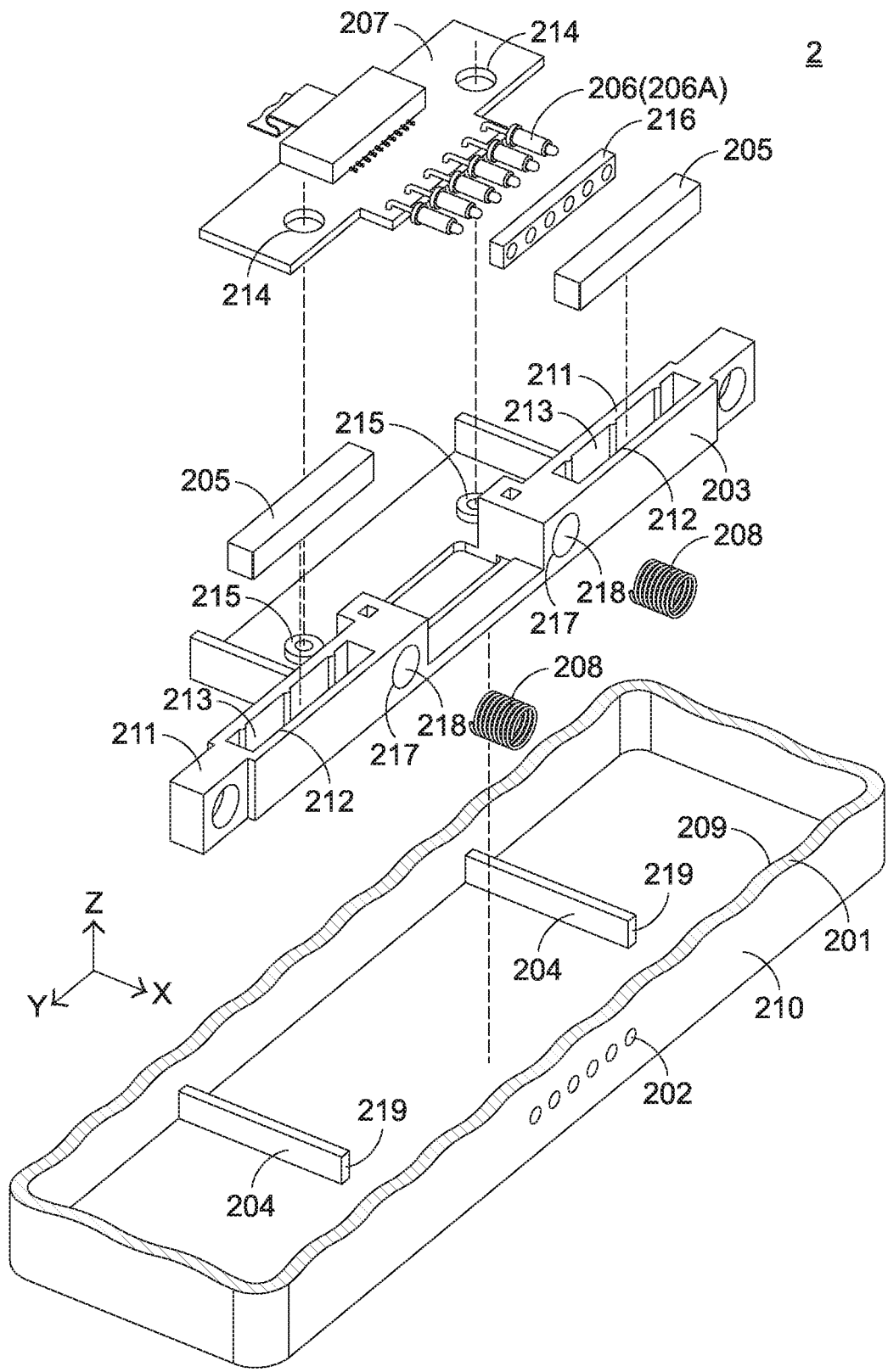
FIG. 3 is a schematic exploded view illustrating the first electronic device of the electronic device assembly as shown in FIG. 1.
Figure 4:
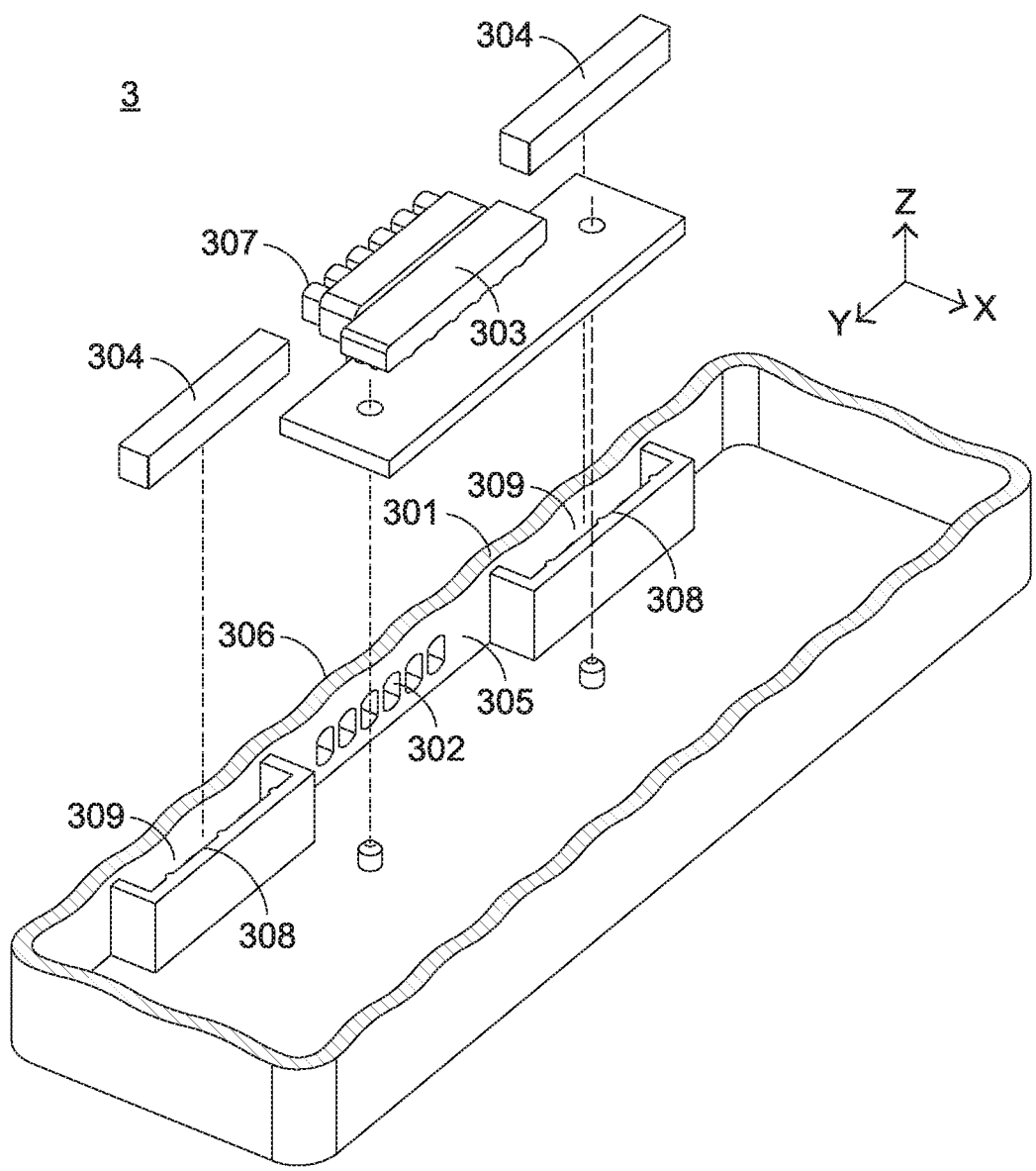
FIG. 4 is a schematic exploded view illustrating the second electronic device of the electronic device assembly as shown in FIG. 1.
Figure 5:
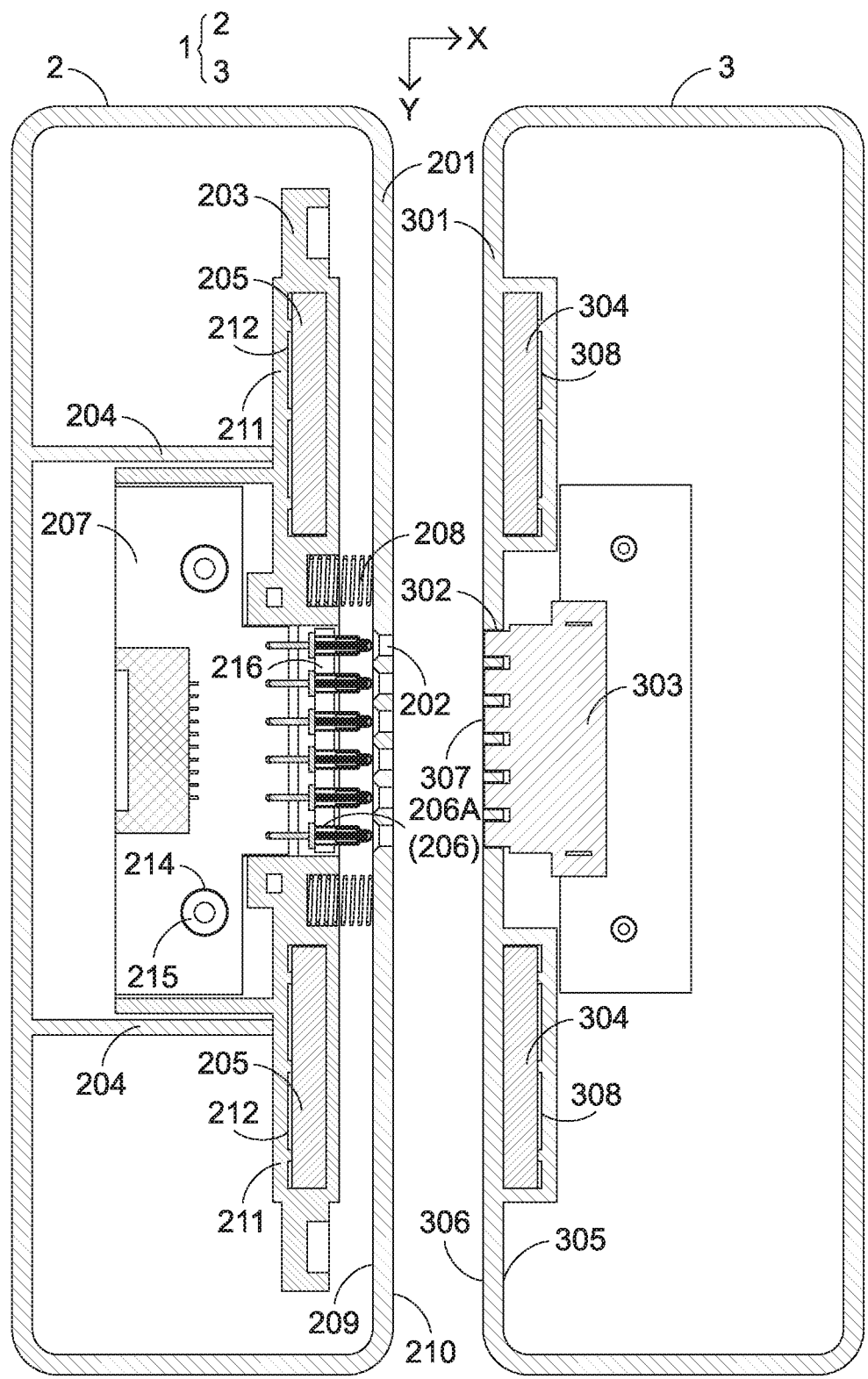
FIG. 5 is a schematic cross-sectional view illustrating the electronic device assembly as shown in FIG. 1 and taken along the line A-A, in which the first electronic device and the second electronic device are separated from each other.
Figure 6:
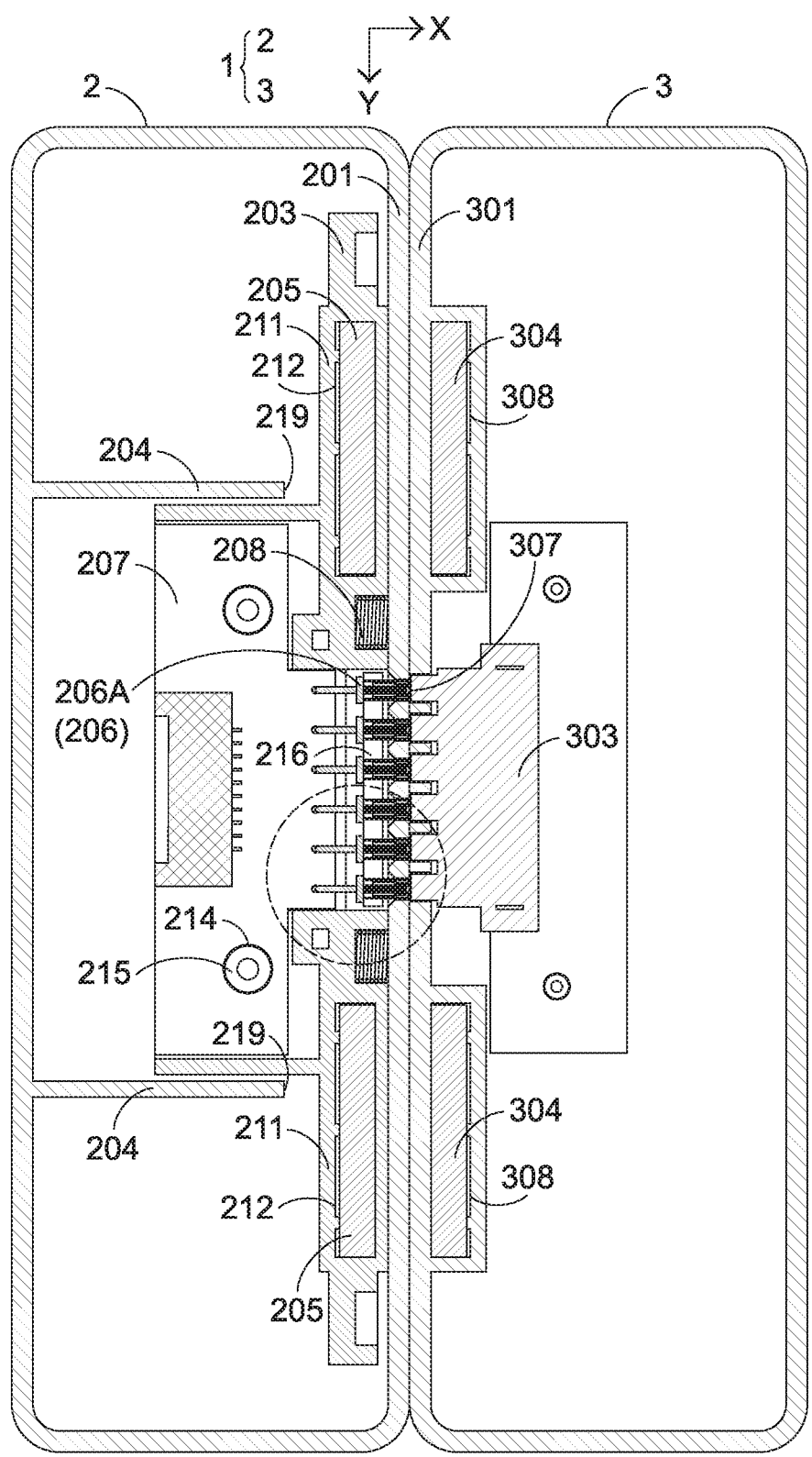
FIG. 6 is a schematic cross-sectional view illustrating the electronic device assembly as shown in FIG. 1 and taken along the line A-A, in which the first electronic device and the second electronic device are close to each other.
Figure 7:
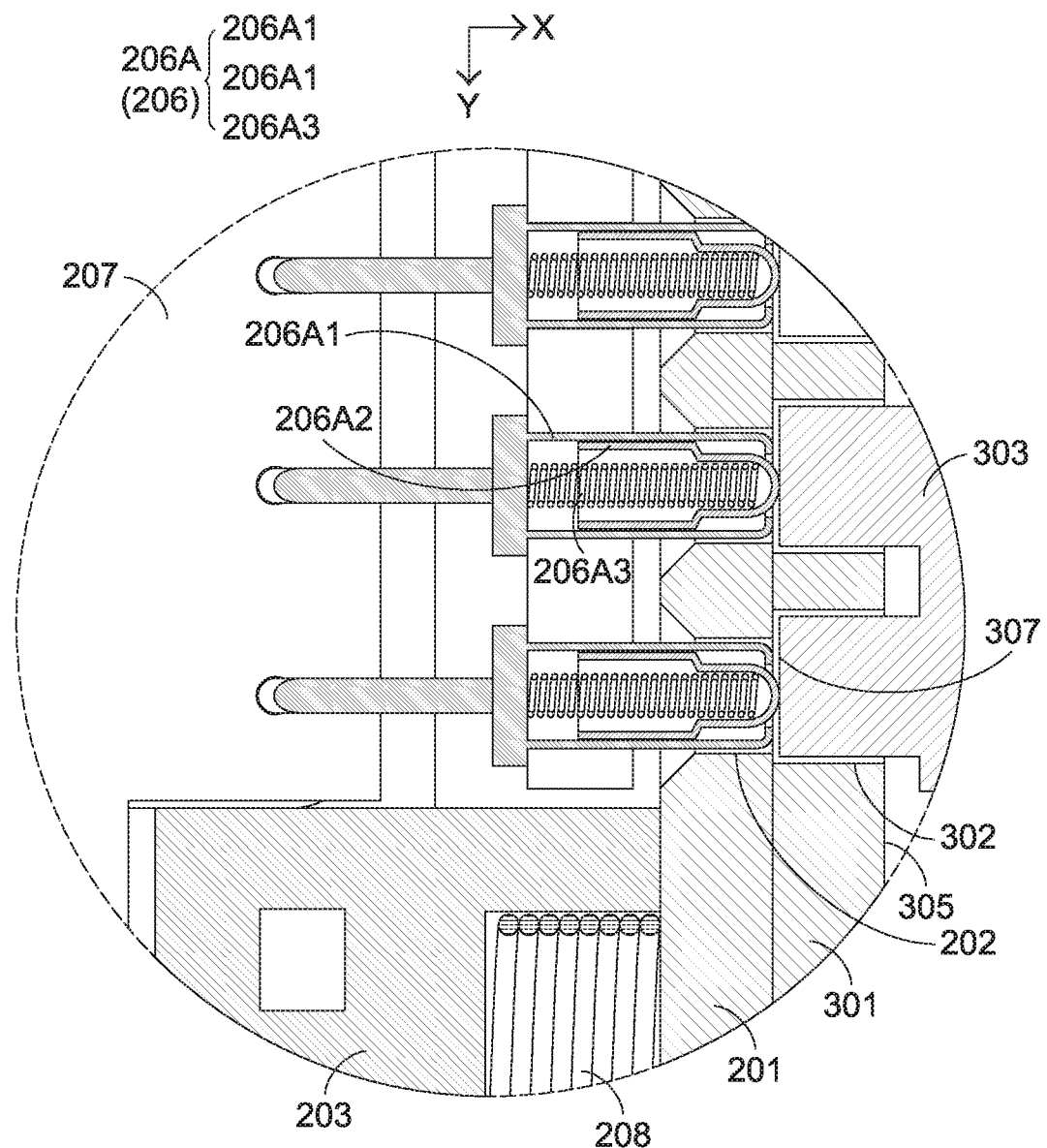
FIG. 7 is a schematic cross-sectional view illustrating an enlarged portion of the electronic device assembly as shown in FIG. 6.

The present invention provides an electronic device assembly. FIG. 1 is a schematic perspective view illustrating a portion of an electronic device assembly according to an embodiment of the present invention. FIG. 2 is a schematic perspective view illustrating a portion of the electronic device assembly as shown in FIG. 1 and taken along another viewpoint. FIG. 3 is a schematic exploded view illustrating the first electronic device of the electronic device assembly as shown in FIG. 1. FIG. 4 is a schematic exploded view illustrating the second electronic device of the electronic device assembly as shown in FIG. 1. FIG. 5 is a schematic cross-sectional view illustrating the electronic device assembly as shown in FIG. 1 and taken along the line A-A, in which the first electronic device and the second electronic device are separated from each other. FIG. 6 is a schematic cross-sectional view illustrating the electronic device assembly as shown in FIG. 1 and taken along the line A-A, in which the first electronic device and the second electronic device are close to each other. FIG. 7 is a schematic cross-sectional view illustrating an enlarged portion of the electronic device assembly as shown in FIG. 6.

As shown in FIGS. 1 to 7, the electronic device assembly 1 comprises a first electronic device 2 and a second electronic device 3.

In an embodiment, the electronic device assembly 1 is a power transmission assembly. That is, one of the first electronic device 2 and the second electronic device 3 is a power providing device, and the other of the first electronic device 2 and the second electronic device 3 is a power receiving device. In another embodiment, the electronic device assembly 1 is a signal transmission assembly. That is, one of the first electronic device 2 and the second electronic device 3 is a signal transmitter, and the other of the first electronic device 2 and the second electronic device 3 is a signal receiver.

The first electronic device 2 comprises a first wall body 201, at least one first opening 202, a sliding seat 203, at least one guiding track 204, at least one first magnetic attraction element 205, a connecting terminal 206, a circuit board 207 and at least one elastic element 208. Correspondingly, the second electronic device 3 comprises a second wall body 301, at least one second opening 302, a connector 303 and at least one second magnetic attraction element 304.

The first wall body 201 of the first electronic device 2 comprises a first inner surface 209 and a first outer surface 210. The at least one first opening 202 is formed in the first wall body 201. Moreover, the at least one first opening 202 runs through the first inner surface 209 and the first outer surface 210.

The sliding seat 203 is disposed within the first electronic device 2. The at least one guiding track 204 is disposed within the first electronic device 2 corresponding to the sliding seat 203. Consequently, the sliding seat 203 is movable along the at least one guiding track 204. In this embodiment, the first electronic device 2 comprises two guiding tracks 204. In addition, the sliding seat 203 is clamped between the two guiding tracks 204. It is noted that the number of the at least one guiding track 204 is not restricted. That is, the number of the at least one guiding track 204 may be increased or decreased according to the practical requirements. It is noted that numerous modifications may be made while retaining the teachings of the present invention. For example, in another embodiment, a concave structure such as a guiding groove (not shown) is disposed within the first electronic device 2. Moreover, the sliding seat 203 can be moved within the guiding groove.

Please refer to FIG. 3. In an embodiment, the sliding seat 203 comprises two wing parts 211. Each wing part 211 is equipped with a receiving recess 212 for accommodating the corresponding first magnetic attraction element 205. When the first magnetic attraction element 205 is accommodated within the receiving recess 212, the first magnetic attraction element 205 is fixed on the sliding seat 203. In this embodiment, the sliding seat 203 comprises two receiving recesses 212, and the first electronic device 1 comprises two first magnetic attraction elements 205. That is, the two first magnetic attraction elements 205 are accommodated within the two receiving recesses 212, respectively. It is noted that the numbers of the receiving recesses 212 and the first magnetic attraction elements 205 may be increased or decreased according to the practical requirements.

As long as the first magnetic attraction element 205 can be fixed on the sliding seat 203 through the receiving recess 212, the shape and the structure of the receiving recess 212 for accommodating the first magnetic attraction element 205 are not restricted. In an embodiment, the receiving recess 212 comprises an entrance 213. The corresponding first magnetic attraction element 205 is placed into the receiving recess 212 through the entrance 213. Structurally, the receiving recess 212 comprises other openings or notches for cooperating or complying with the space or layout of the first electronic device 2 or reducing the weight or volume of the sliding seat. As shown in FIGS. 1, 2 and 3, the entrance 213 of the receiving recess 212 points to the upward side (i.e., along the Z-axis direction). It is noted that the pointing direction of the entrance 213 is not restricted. For example, in some other embodiments, the entrance 213 of the receiving recess 212 points to the X-axis direction or the Y-axis direction.

In the first electronic device 2, the connecting terminal 206 is fixed on the sliding seat 203. As the sliding seat 203 is moved, the connecting terminal 206 is correspondingly moved. In this embodiment, the connecting terminal 206 is installed on the circuit board 207. The circuit board 207 is fixed on the sliding seat 203. Consequently, the connecting terminal 206 is fixed on the sliding seat 203 and slidable with the sliding seat 203. In some other embodiments, the connecting terminal 206 is directly fixed on the sliding seat 203 and not disposed on the circuit board 207. The connecting terminal 206 can be used to transfer electric power or signals through another electric signal transmission device (e.g., a connector or a cable).

Please refer to FIGS. 1, 2 and 3. The circuit board 207 comprises at least one perforation 214. The sliding seat 203 comprises at least one fixing post 215 corresponding to the at least one perforation 214. When the at least one perforation 214 is sheathed around the corresponding fixing post 215, the circuit board 207 is assembled with and fixed on the sliding seat 203. In some other embodiments, the fixing post 215 of the sliding seat 203 is a stud. After at least one screw (not shown) is penetrated through the corresponding perforation 214 and tightened into the fixing post, the circuit board 207 is fixed on the sliding seat 203.

In an embodiment, the connecting terminal 206 comprises at least one Pogo pin 206A. For example, the first electronic device 2 comprises six Pogo pins 206A. It is noted that the number of the Pogo pins 206A is not restricted. That is, the number of the Pogo pins 206A may be increased or decreased according to the practical requirements or specifications. Each Pogo pin 206A comprises a tube 206A1, a plunger 206A2 and a spring 206A3. The spring 206A3 is arranged between the tube 206A1 and the plunger 206A2. In some embodiments, the Pogo pins 206A are discretely penetrated through a positioning and separating element 216. Due to the positioning and separating element 216, every two adjacent Pogo pins 206A are separated from each other at a fixed spacing interval.

In the first electronic device 2, the at least one elastic element 208 is arranged between the sliding seat 203 and the first wall body 201. A first end of the elastic element 208 is contacted with the first inner surface 209 of the first wall body 201. A second end of the elastic element 208 is contacted with the sliding seat 203. In an embodiment, the sliding seat 203 further comprises a receiving recess 217 corresponding to the elastic element 208. An entrance 218 of the receiving recess 217 faces the first wall body 201. When the sliding seat 203 is close to the first wall body 201, the elastic element 208 is compressed and received within the receiving recess 217. Consequently, the sliding seat 203 can be tightly attached or contacted with the first wall body 201. Due to the arrangement of the receiving recess 217, the gap between the sliding seat 203 and the first wall body 201 is not increased. In an embodiment, the elastic element 208 is a spring, a torsion spring, a shrapnel, a rubber ring or a foam structure. In this embodiment, the spring is taken as an example of the elastic element 208.

In an embodiment, a stopping structure (not shown) is additionally disposed within the first electronic device 2. As the sliding seat 203 is pushed by the elastic element 208, the sliding seat 203 is contacted with the stopping structure. Consequently, the movable range of the sliding seat 203 is limited. In the first electronic device 2, the guiding track 204 can be used to guide the movement of the sliding seat 203. Moreover, an end part 219 of the guiding track 204 can be used as a stopping structure. The corresponding wing part 211 of the sliding seat 203 is contacted with the end part 219 of the guiding track 204.

The second wall body 301 of the second electronic device 3 comprises a second inner surface 305 and a second outer surface 306. The at least one second opening 302 is formed in the second wall body 301. Moreover, the at least one second opening 302 runs through the second inner surface 305 and the second outer surface 306. The connector 303 is disposed within the second electronic device 3. The connector 303 comprises plural contact parts 307. The plural contact parts 307 are exposed to plural second openings 302 of the second wall body 301.

The second electronic device 3 comprises at least one receiving recess 308 for accommodating the corresponding second magnetic attraction element 304. When the second magnetic attraction element 304 is accommodated within the receiving recess 308, the second magnetic attraction element 304 is fixed on the second electronic device 3. In this embodiment, the second electronic device 3 comprises two receiving recesses 308 and two second magnetic attraction elements 304. That is, the two second magnetic attraction elements 304 are accommodated within the two receiving recesses 308, respectively. It is noted that the numbers of the receiving recesses 308 and the second magnetic attraction elements 304 may be increased or decreased according to the practical requirements.

As long as the second magnetic attraction element 304 can be fixed on the second electronic device 3 through the receiving recess 308, the shape and the structure of the receiving recess 308 for accommodating the second magnetic attraction element 304 are not restricted. In an embodiment, the receiving recess 308 comprises an entrance 309. The corresponding second magnetic attraction element 304 is placed into the receiving recess 308 through the entrance 309. Structurally, the receiving recess 308 comprises other openings or notches for cooperating or complying with the space or layout of the second electronic device 3. As shown in FIGS. 1, 2 and 3, the entrance 309 of the receiving recess 308 points to the upward side (i.e., along the Z-axis direction). It is noted that the pointing direction of the entrance 309 is not restricted. For example, in some other embodiments, the entrance 309 of the receiving recess 308 points to the X-axis direction or the Y-axis direction.

In this embodiment, the first magnetic attraction element 205 is a magnet, and the second magnetic attraction element 304 is another magnet or a magnetic conductor. In some other embodiments, the second magnetic attraction element 304 is a magnet, and the first magnetic attraction element 205 is another magnet or a magnetic conductor. The magnetic conductor is an object that can be magnetically attracted by the magnet. The material of the magnetic conductor is selected from iron, nickel or cobalt.

In case that the first magnetic attraction element 205 and the second magnetic attraction element 304 are magnets, the first magnetic attraction element 205 and the second magnetic attraction element 304 comply with the unlike-pole attraction relationship. In an example, the N pole of the first magnetic attraction element 205 faces the S pole of the second magnetic attraction element 304. Alternatively, in another embodiment, the S pole of the first magnetic attraction element 205 faces the N pole of the second magnetic attraction element 304.

Please refer to FIGS. 5 and 6. As shown in FIG. 6, when the second wall body 301 of the second electronic device 3 is close to the first wall body 201 of the first electronic device 2, the second magnetic attraction element 304 and the first magnetic attraction element 205 on the sliding seat 203 are magnetically attracted by each other. Consequently, the sliding seat 203 in the first electronic device 2 is driven to be moved toward the first wall body 201. As the sliding seat 203 is moved toward the first wall body 201, the connecting terminal 206 fixed on the sliding seat 203 is correspondingly moved and protruded outside the at least one first opening 202. When the connecting terminal 206 is contacted with the corresponding contact part 307 of the connector 303, the connecting terminal 206 and the connector 303 are electrically connected with each other. Under this circumstance, since the magnetic attractive force between the first magnetic attraction element 205 and the second magnetic attraction element 304 is large enough to compress the elastic element 208, the elastic element 208 is compressed by the sliding seat 203 and the first wall body 201. Consequently, the elastic element 208 is accommodated within the receiving recess 217.

Due to the magnetic attraction between the first magnetic attraction element 205 and the second magnetic attraction element 304, the first electronic device 2 and the second electronic device 3 are tightly contacted with each other. As mentioned above, the connecting terminal 206 comprises at least one Pogo pin 206A. When the plunger 206A2 of the Pogo pin 206A is contacted with the contact part 307 of the connector 303, the plunger 206A2 is retracted in response to the elastic force of the spring 206A3. Consequently, the Pogo pin 206A (or the connecting terminal 206) is protected. That is, the Pogo pin 206A (or the connecting terminal 206) is not damaged or deviated in response to the instantaneous contact or impact.

As shown in FIG. 5, when the second wall body 301 of the second electronic device 3 is separated from the first wall body 201 of the first electronic device 2, the second magnetic attraction element 304 and the first magnetic attraction element 205 are not magnetically attracted by each other. Consequently, the compressed elastic element 208 is restored, and the sliding seat 203 is moved in the direction away from the first wall body 201 in response to the restored elastic element 208. The sliding seat 203 is continuously moved until the wing part 211 is contacted with the stopping structure (e.g., the end part 219 of the guiding track 204). As the sliding seat 203 is moved, the connecting terminal 206 on the sliding seat 203 is correspondingly moved and retracted inside the first electronic device 2. Consequently, even if the first electronic device 2 is hit by an external force, the connecting terminal 206 is not damaged. In other words, the purpose of protecting the connecting terminal 206 is achieved.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. An electronic device assembly, comprising:
a first electronic device comprising a first wall body, a first opening, a sliding seat, a first magnetic attraction element, an elastic element and a connecting terminal, wherein the first opening is formed in the first wall body, the sliding seat is disposed within the first electronic device, the first magnetic attraction element is fixed on the sliding seat, the elastic element is arranged between the sliding seat and the first wall body, and the connecting terminal is fixed on the sliding seat; and
a second electronic device comprising a second wall body, a connector and a second magnetic attraction element, wherein a portion of the connector is exposed outside the second wall body,
wherein when the second wall body is close to the first wall body, the second magnetic attraction element and the first magnetic attraction element are magnetically attracted by each other, so that the sliding seat is driven to be moved toward the first wall body, wherein as the sliding seat is moved toward the first wall body, the elastic element is compressed, and the connecting terminal is protruded outside the first opening and contacted with the connector,
wherein when the second wall body is separated from the first wall body, the compressed elastic element is restored, so that the sliding seat is moved away from the first wall body and the connecting terminal is retracted inside the first electronic device.

2. The electronic device assembly according to claim 1, wherein the first electronic device further comprises a circuit board, wherein the connecting terminal is installed on the circuit board, and the circuit board is fixed on the sliding seat.

3. The electronic device assembly according to claim 1, wherein the connecting terminal comprises a Pogo pin.

4. The electronic device assembly according to claim 3, wherein the Pogo pin comprises a tube, a plunger and a spring, wherein the spring is arranged between the tube and the plunger.

5. The electronic device assembly according to claim 1, wherein the first electronic device further comprises a guiding track, and the sliding seat is movable along the guiding track.

6. The electronic device assembly according to claim 1, wherein the first electronic device further comprises a stopping structure, wherein after the compressed elastic element is restored and the sliding seat is moved away from the first wall body, the sliding seat is contacted with the stopping structure.

7. The electronic device assembly according to claim 1, wherein the first electronic device further comprises a guiding track, and the guiding track comprises an end part, wherein after the compressed elastic element is restored and the sliding seat is moved away from the first wall body, the sliding seat is contacted with the end part of the guiding track.

8. The electronic device assembly according to claim 1, wherein the sliding seat comprises a receiving recess, and the first magnetic attraction element is disposed within the receiving recess.

9. The electronic device assembly according to claim 1, wherein the second electronic device further comprises a receiving recess, wherein the receiving recess is formed in the second wall body, and the second magnetic attraction element is disposed within the receiving recess.

10. The electronic device assembly according to claim 1, wherein the first magnetic attraction element is a magnet, and the second magnetic attraction element is another magnet or a magnetic conductor, wherein the magnetic conductor is made of iron, nickel or cobalt.

11. The electronic device assembly according to claim 1, wherein the second magnetic attraction element is a magnet, and the first magnetic attraction element is another magnet or a magnetic conductor, wherein the magnetic conductor is made of iron, nickel or cobalt.

12. The electronic device assembly according to claim 1, wherein the sliding seat comprises a receiving recess, wherein when the sliding seat is moved toward the first wall body, the elastic element is accommodated within the receiving recess.

13. The electronic device assembly according to claim 1, wherein the elastic element is a spring, a torsion spring, a shrapnel, a rubber ring or a foam structure.

14. The electronic device assembly according to claim 1, wherein the second electronic device further comprises a second opening, wherein the second opening is formed in the second wall body, and the connector is exposed to the second opening.

15. The electronic device assembly according to claim 1, wherein the elastic element is compressed in response to a magnetic attractive force between the between the first magnetic attraction element and the second magnetic attraction element.

* * * * *